US012371317B2

(12) United States Patent
Pardo et al.

(10) Patent No.: US 12,371,317 B2
(45) Date of Patent: Jul. 29, 2025

(54) MICROACTUATOR APPARATUS AND SYSTEM

(71) Applicant: Nokia Technologies Oy, Espoo (FI)

(72) Inventors: Flavio Pardo, Glen Gardner, NJ (US); Todd Salamon, New Providence, NJ (US); Corey Pollock, Cambridge, MA (US)

(73) Assignee: Nokia Technologies Oy, Espoo (FI)

( * ) Notice: Subject to any disclaimer, the term of this patent is extended or adjusted under 35 U.S.C. 154(b) by 528 days.

(21) Appl. No.: 17/779,220

(22) PCT Filed: Oct. 23, 2020

(86) PCT No.: PCT/IB2020/059983
§ 371 (c)(1),
(2) Date: May 24, 2022

(87) PCT Pub. No.: WO2021/105788
PCT Pub. Date: Jun. 3, 2021

(65) Prior Publication Data
US 2023/0002216 A1 Jan. 5, 2023

(30) Foreign Application Priority Data

Nov. 28, 2019 (GB) .................................. 1917318

(51) Int. Cl.
*B81B 3/00* (2006.01)
*G02B 26/08* (2006.01)
*G02B 26/10* (2006.01)

(52) U.S. Cl.
CPC ........ *B81B 3/0081* (2013.01); *G02B 26/0866* (2013.01); *G02B 26/101* (2013.01); *B81B 2201/032* (2013.01); *B81B 2201/042* (2013.01); *B81B 2203/0118* (2013.01); *B81B 2203/019* (2013.01); *B81B 2203/058* (2013.01)

(58) Field of Classification Search
None
See application file for complete search history.

(56) References Cited

U.S. PATENT DOCUMENTS

| 6,094,289 | A | 7/2000 | Moranski et al. | |
|---|---|---|---|---|
| 6,679,055 | B1* | 1/2004 | Ellis | H01H 61/04 60/527 |
| 7,999,635 | B1* | 8/2011 | Quevy | H03H 9/02409 333/197 |
| 2002/0146200 | A1* | 10/2002 | Kudrle | G02B 6/357 359/872 |
| 2005/0136663 | A1 | 6/2005 | Terence Gan et al. | |

(Continued)

OTHER PUBLICATIONS

Morrison, "Statics and dynamics of electrothermal micromirrors", Dissertation, 2016, 166 pages.

(Continued)

*Primary Examiner* — Ryan Crockett
(74) *Attorney, Agent, or Firm* — Nokia Technologies Oy

(57) ABSTRACT

An apparatus comprising: a thermally-actuated microactuator configured to deflect a component in dependence on an applied stimulus; and an extender having a length configured to increase deflection of the component by the microactuator, wherein the extender comprises one or more voids.

13 Claims, 5 Drawing Sheets

(56) References Cited

U.S. PATENT DOCUMENTS

| | | | | |
|---|---|---|---|---|
| 2010/0307150 | A1* | 12/2010 | Wu | B81B 3/0024 60/528 |
| 2011/0093987 | A1 | 4/2011 | Sarkar | |
| 2012/0140302 | A1 | 6/2012 | Xie et al. | |
| 2012/0319226 | A1 | 12/2012 | Pal et al. | |
| 2020/0209617 | A1* | 7/2020 | Kimura | G02B 26/0858 |

OTHER PUBLICATIONS

Koh et al., "A Two-Dimensional MEMS Scanning Mirror Using Hybrid Actuation Mechanisms With Low Operation Voltage", Journal of Microelectromechanical Systems, vol. 21, No. 5, Oct. 2012, pp. 1124-1135.

Wang et al., "An Ultra-fast Electrothermal Micromirror with Bimorph Actuators Made of Copper/tungsten", International Conference on Optical MEMS and Nanophotonics (OMN), Aug. 13-17, 2017, 2 pages.

Kiuchi et al., "Fringe-tunable electrothermal Fresnel mirror for use in compact and high-speed diffusion sensor", Optics Express, vol. 25, No. 2, 2017, 10 pages.

Zhou et al., "An Electrothermal Cu/W Bimorph Tip-Tilt-Piston MEMS Mirror with High Reliability", Micromachines, vol. 10, No. 5, 2019, pp. 1-14.

Churchill et al., "Correlating equations for laminar and turbulent free convection from a horizontal cylinder", International Journal of Heat and Mass Transfer, vol. 18, Sep. 1975, pp. 1049-1053.

Search Report received for corresponding United Kingdom Patent Application No. 1917318.6, dated Sep. 22, 2020, 4 pages.

Jain et al., "A thermal bimorph micromirror with large bi-directional and vertical actuation", Sensors and Actuators A: Physical, vol. 122, No. 1, Jul. 29, 2005, pp. 9-15.

International Search Report and Written Opinion received for corresponding Patent Cooperation Treaty Application No. PCT/IB2020/059983, dated Jan. 12, 2021, 12 pages.

Samanta et al., "Low-cost electrothermally actuated MEMS mirrors for high-speed linear raster scanning", Optica vol. 9, No. 2, Feb. 2022, pp. 251-257.

* cited by examiner

MICROACTUATOR APPARATUS AND SYSTEM

RELATED APPLICATION

This application claims priority to PCT Application No. PCT/IB2020/059983, filed on Oct. 23, 2020, which claims priority to GB Application No. 1917318.6, filed on Nov. 28, 2019, the contents of which are incorporated herein by reference in their entirety.

TECHNOLOGICAL FIELD

Embodiments of the present disclosure relate to an apparatus comprising one or more microactuators, and a system. Some relate to a microactuator apparatus and system for deflecting an optical component.

BACKGROUND

A microactuator is a type of microelectromechanical system (MEMS) that functions as an actuator.

It is desirable to provide a microactuator that is fast, easy to miniaturize, and requires low electrical voltage to operate. These characteristics are desirable for use cases such as optical coherence tomography.

BRIEF SUMMARY

According to various, but not necessarily all, embodiments there is provided an apparatus comprising: a thermally-actuated microactuator configured to deflect a component in dependence on an applied stimulus; and an extender configured to increase deflection of the component by the microactuator, wherein the extender comprises one or more voids.

In some, but not necessarily all examples the extender has a void fraction of at least 25%.

In some, but not necessarily all examples the extender comprises a framework of spaced members separated by one or more voids.

In some, but not necessarily all examples the length of the extender is at least 25% of the length of the microactuator.

In some, but not necessarily all examples at least the extender is cantilevered.

In some, but not necessarily all examples the microactuator comprises a bimorph, wherein the bimorph comprises a first layer and a second layer, and wherein the first layer and the second layer have different coefficients of thermal expansion.

In some, but not necessarily all examples a portion of the first layer extends beyond the second layer, the extender comprising the portion of the first layer.

In some, but not necessarily all examples the first layer and/or the second layer is configured as a resistive heater.

In some, but not necessarily all examples the microactuator comprises at least one electrically isolating slot through the first layer and the second layer, and wherein the second layer comprises a direction change extending from one side of the slot to the other side of the slot.

In some, but not necessarily all examples the second layer comprises one or more discontinuities along its electrical length, to configure material at the one or more discontinuities, different from material of the second layer, for resistive heating.

In some, but not necessarily all examples the microactuator is one of a plurality of microactuators of the apparatus, wherein the plurality of microactuators are arranged to enable deflection of the component about a plurality of axes.

In some, but not necessarily all examples at least a first pair of the plurality of microactuators is configured to enable rotation of the component about a first axis, and wherein at least a second pair of the plurality of microactuators is configured to enable rotation of the component about a second axis.

In some, but not necessarily all examples the apparatus comprises the component, wherein the component is an optical component. The optical component may be a reflector.

In some, but not necessarily all examples the reflector may be an optical mirror.

In some, but not necessarily all examples the apparatus comprises an optical coherence tomography system, wherein the optical component is positioned so that light from a light source of the optical coherence tomography system is incident on the optical component, and wherein the microactuator is configured to move the optical component in at least one direction relative to the optical coherence tomography system.

According to various, but not necessarily all, embodiments there is provided an apparatus comprising: a microactuator beam configured to deflect a component in dependence on an applied stimulus; and an extender configured to increase deflection of the component by the microactuator, wherein the extender comprises one or more voids.

According to various, but not necessarily all, embodiments there is provided examples as claimed in the appended claims.

The apparatus may be a microactuator apparatus.

BRIEF DESCRIPTION

Some examples will now be described with reference to the accompanying drawings in which.

DETAILED DESCRIPTION

The Figures illustrate an apparatus 1 comprising: a thermally-actuated microactuator 10 configured to deflect a component 14 in dependence on an applied stimulus; and an extender 12 configured to increase deflection of the component 14 by the microactuator 10, wherein the extender 12 comprises one or more voids. The void fraction reduces mass and/or thermal mass of the extender 12.

Figure 1:
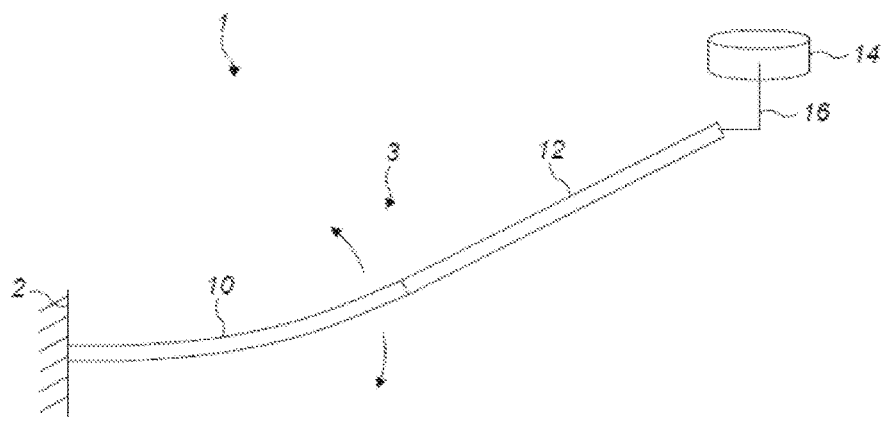
FIG. 1 shows an example of the subject matter described herein.

FIG. 1 schematically illustrates an example of an apparatus 1. The apparatus 1 comprises the thermally-actuated microactuator 10 and the extender 12. A combination of a microactuator 10 and an extender 12 may form a beam 3 (microactuator beam). The microactuator 10 is the part of the apparatus 1 configured to supply mechanical energy in dependence on the applied stimulus. The extender 12 does not supply actuation energy. For example, the extender 12 may be configured not to receive the stimulus.

In FIG. 1, but not necessarily in all examples, the mechanical energy output by the microactuator 10 is resilient deflection. Resilient deflection implies that the microactuator 10 stays in its elastically deflected state while held in that state by actuation force and returns to its neutral equilibrium shape when the actuation force is released. Elastic deflection implies that the deflection is reproducible without causing plastic deformation. The applied stimulus may be configured to control curvature of the microactuator 10, to cause the deflection. Therefore, the deflection may be a form of contortion that controls curvature. The applied stimulus may be electrical resistive heating as described herein, or another stimulus causing thermal actuation.

As shown, the beam 3 may be cantilevered, because a cantilever is more flexible than a beam supported at multiple locations along its length. In some, but not necessarily all examples, a beam 3 may comprise no more than one microactuator 10. The microactuator 10 may be operably coupled to a component 14 to be actuated via the extender 12. The beam 3 may at least partially support the component 14. In the Figures, a fixed end 2 of the microactuator 10 is secured to a rigid body such as a substrate. The extender 12 is located to the free end of the microactuator 10. The extender 12 terminates at a free end which is a tip region of the cantilever.

The component 14 is operably coupled to the free end of the extender 12, for example at a tip region of the extender 12. The component 14 may be coupled to the extender 12 via a separate coupling means (e.g. coupling member 16) as illustrated, or alternatively the component 14 may be directly coupled to the extender 12.

The coupling member 16 comprises the same or a different material from the extender 12. The coupling member 16 may have a smaller cross-sectional area than the extender 12. In some, but not necessarily all examples the coupling member 16 comprises a spring such as a serpentine spring.

Figure 5:
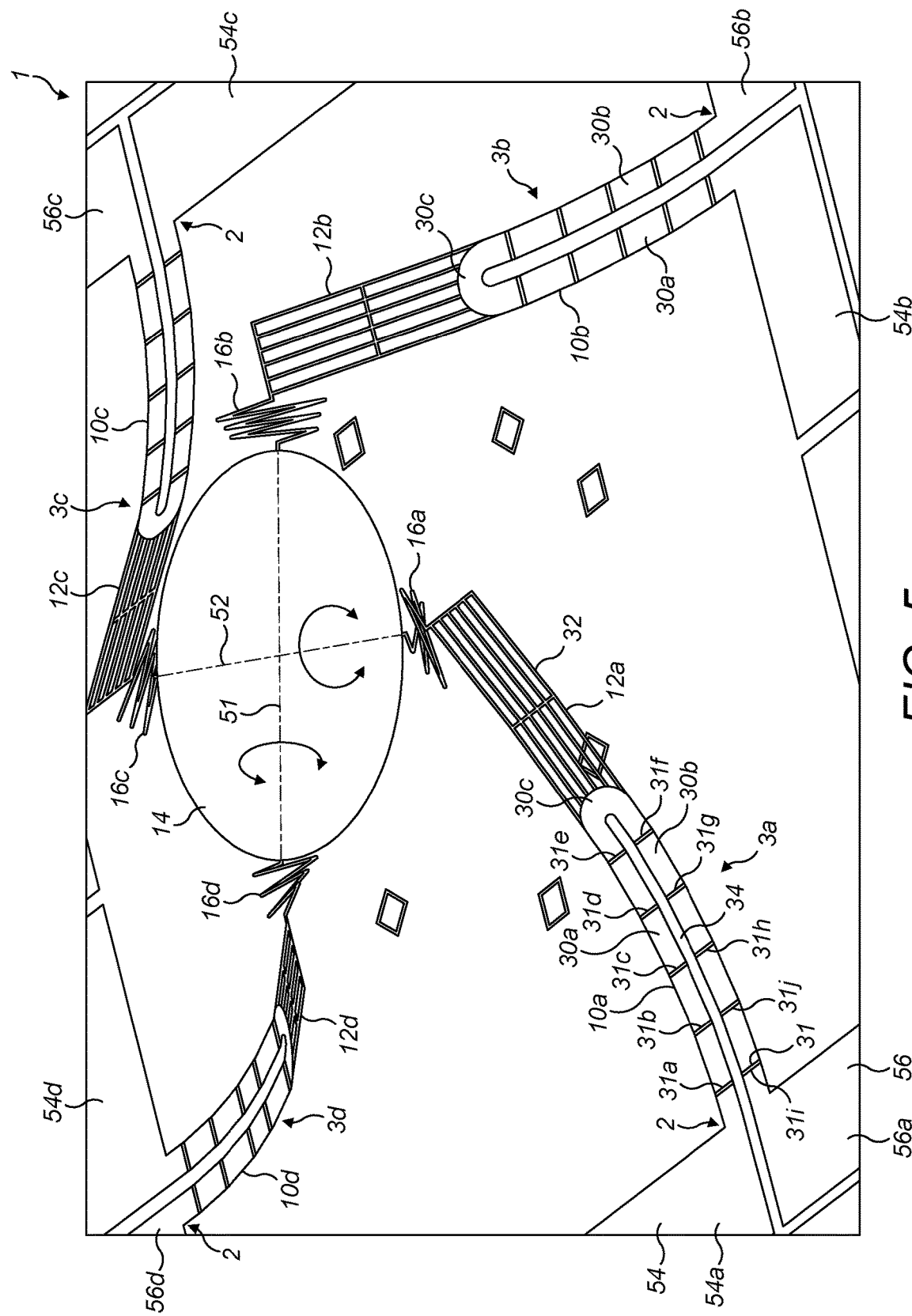
FIG. 5 shows another example of the subject matter described herein.

In FIG. 5, but not necessarily all examples, the component 14 is suspended from the ends of the beams 3a-3d by the coupling members 16a-16d. This floating method of supporting the component 14 reduces the energy required to deflect the component 14 and/or enables more degrees of freedom of deflection.

The extender 12 functions as a length-extending beam ('extender beam') to enable a reduced-length microactuator 10 without substantially reducing the range of deflection. Reducing the length of the microactuator 10 reduces the thermal response time of the microactuator 10. Therefore, an applied stimulus can achieve the same range of deflection in a shorter time period. In this case, the tip region is moved by a similar distance as achievable with a full-length microactuator 10.

In some, but not necessarily all examples the length L2 of the extender 12 is at least 25% of the length of the microactuator 10. The length L1 of the microactuator 10 may be some or all of the remaining span from the fixed end 2. For the purposes of this disclosure, the span does not include the coupling member 16.

The length L2 may be equal to or less than L1 within a suitable margin. Alternatively, L2 could be longer than L1.

Figure 2:
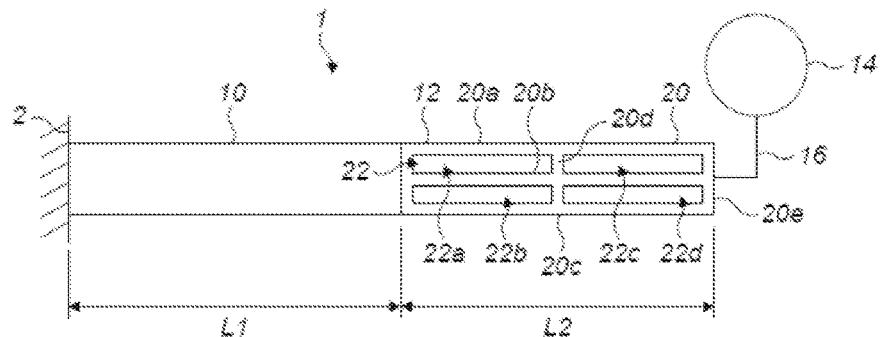
FIG. 2 shows another example of the subject matter described herein.

FIG. 2 shows a top-down view of the example apparatus 1 of FIG. 1. FIG. 2 shows that the extender 12 comprises one or more voids 22, to reduce thermal mass of the extender 12. A high thermal mass increases response times, defined as the time taken to reach steady state. This is because heat is conducted through the microactuator 10 to the extender 12, so an extender 12 with a greater thermal mass would require a greater amount of heat to pass through the microactuator 10, to achieve steady state. Therefore, it is desirable for the extender 12 to have the lowest possible thermal mass relative to that of the microactuator 10. A technical effect of the one or more voids 22 is that response times are improved.

Thermal mass depends on mass, density and specific heat capacity, and in this case the void fraction reduces the mass of the extender 12, and the effective density of the shape.

In some, but not necessarily all examples the void fraction of the extender 12 is at least 25% and/or less than 85%. Void fraction is a percentage/fraction of the volume of void space relative to the total volume of the extender 12. This range provides an optimum compromise of: reduced response time due to a sufficient reduction in thermal mass; and sufficient mechanical stability.

The voids 22 may comprise accessible (open) voids as shown herein, and/or internal inaccessible voids.

FIG. 2 shows that the extender 12 may comprise a framework 20 of spaced members (20a- ... 20n)- ... 20n) ('frame members') separated by voids (22a- ... 22n) where 'n' is the total number of members. The members are elongated and thin relative to the width of the microactuator 10.

Although four voids 22a-22d are shown in FIG. 2, the extender 12 may be regarded as comprising one or more voids 22. The number of voids 22 is dependent on the specific implementation. However, having multiple spatially distributed voids 22 can provide greater mechanical strength against bending and/or twisting than having only one large void 22. In the Figures, the framework 20 defines a matrix pattern of voids 22a-22d arranged in a plurality of rows and a plurality of columns, such as 2×2 or 5×2.

In the Figures, but not necessarily in all examples, the frame members comprise first members 20a-20c, and one or more second cross-members 20d-20e interconnecting two or more first members 20a-20c. The first members 20a-20c may be relatively long members and the cross-members 20d-20e may be relatively short members. A void 22 is the internal area defined by three or more of the members 20a-20e, in cross-section view.

Figure 4A:
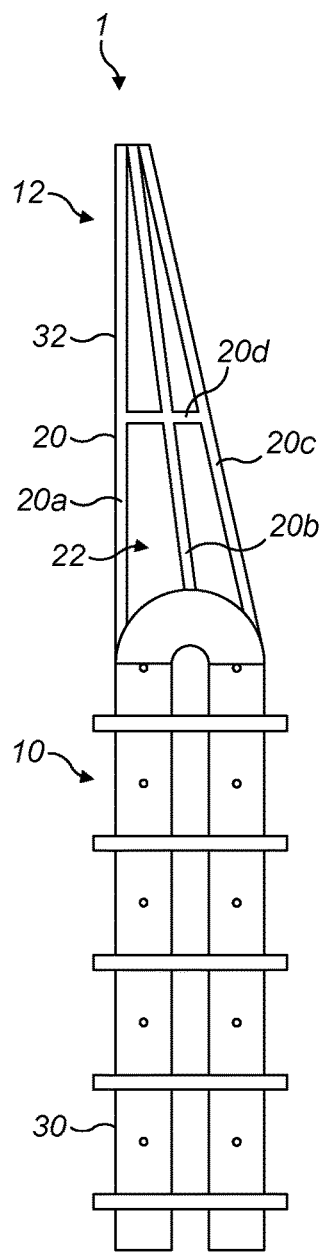
FIG. 4A, 4B, 4C shows other examples of the subject matter described herein.
Figure 4B:
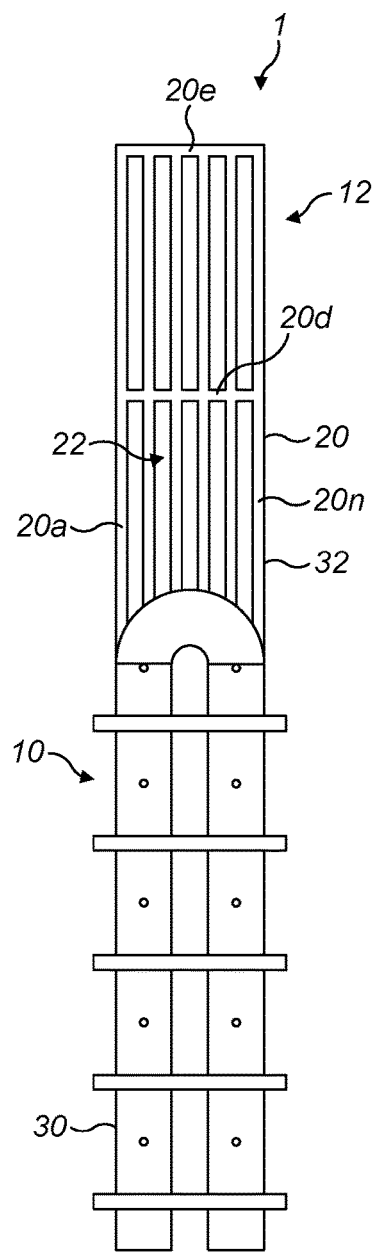

FIG. 4B shows a plurality of parallel first members 20a- ... 20n, separated across the width of the microactuator 10. Alternatively, as shown in FIG. 4A, fewer than all of the first members 20a-20c may be parallel.

The extender 12 may form either a quadrilateral shape of FIG. 4B or a different polygonal shape such as a triangular shape of FIG. 4A, in the length-width plane of the extender 12. The edges of a void 22 may form a quadrilateral, triangular or other polygonal shape, or even an irregular shape depending on the manufacturing method. The edges of a void 22 may form a closed shape as shown, to improve mechanical stability against bending and/or twisting.

A cross-member 20d may be provided at a location along the span of the first members, to further improve rigidity. In FIG. 4B, a further cross-member 20e is provided at the free end/tip region of the extender 12, to improve rigidity. By contrast, in FIG. 4A there is no requirement for a cross-member 20e at the free end of the extender 12 because the first members 20a-20c converge and interconnect at the free end, forming an acute angle therebetween.

Figure 4C:
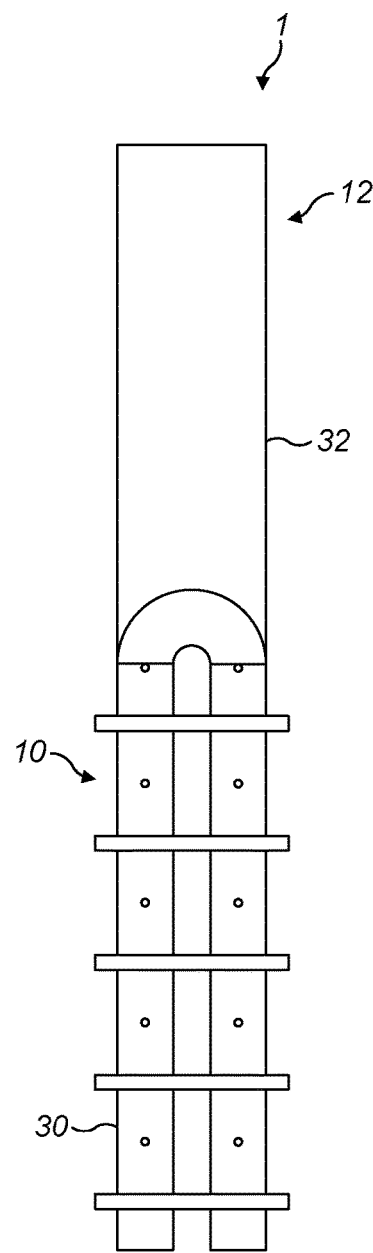

FIG. 4C shows an example of a void-less extender 12, for comparative purposes.

Figure 3A:
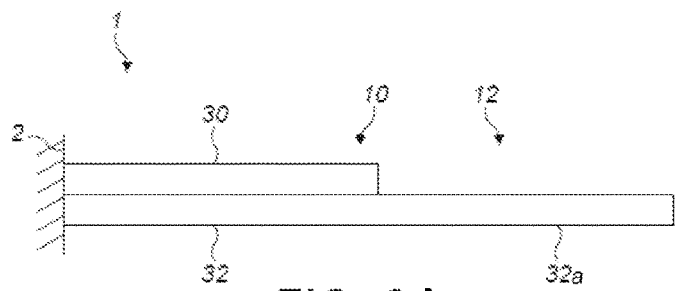
FIG. 3A, 3B shows other examples of the subject matter described herein.

In FIG. 3A, but not necessarily all examples, the microactuator 10 comprises a bimorph. A bimorph is a structure used for actuation which comprises at least two active layers. The bimorph comprises a first layer 32 and a second layer 30. The first layer 32 has a first coefficient of thermal expansion. The second layer 30 has a second, different coefficient of thermal expansion. It would be appreciated that one or more intermediate layers could be provided between the first layer 32 and the second layer 30.

In an implementation, the first layer 32 comprises polysilicon, and the second layer 30 comprises gold. This pairing has a high thermal diffusivity as well as a significant difference in thermal expansion coefficients. Thermal diffusivity is a key factor in controlling heat dissipation and therefore the thermal response time of actuation.

In some examples, chromium, nichrome, aluminium or copper may be used instead of gold, among other possibilities that are generally, but not always metals.

In some examples, silicon dioxide, SU-8 or tungsten may be used instead of polysilicon, among other possibilities that are either metals or nonmetals.

Example first layer 32—second layer 30 pairings include: silicon dioxide—chromium; silicon dioxide—aluminium; SU-8—nichrome; tungsten—aluminium; tungsten—copper; or copper-aluminium.

SU-8 is composed of Bisphenol A Novolac epoxy dissolved in an organic solvent (usually gamma-butyrolactone GBL or cyclopentanone), and up to 10% by weight of mixed Triarylsulfonium/hexafluoroantimonate salt.

In some, but not necessarily all examples, the materials chosen may have thermal diffusivities no less than $10^{-5}$ m$^2$/s, therefore excluding materials such as SU-8, nichrome and silicon dioxide and preferring materials such as polysilicon or metals. Polysilicon has the additional advantage of reduced fatigue compared to metals, to increase durability.

If electrical current is to be passed through one layer of the bimorph to act as a heater, then nonmetal-metal such as polysilicon-metal represents a better pairing than metal-metal combinations which may require electrical isolation between the layers.

Figure 3B:
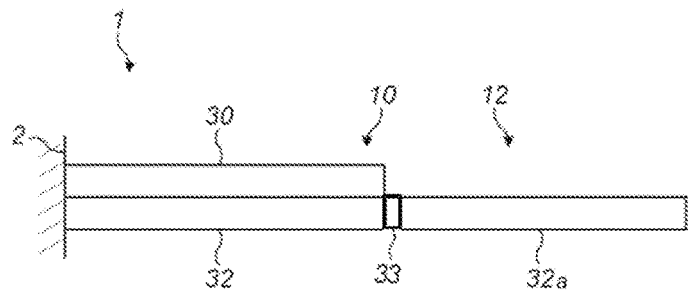

FIG. 3A shows that a portion 32a of the first layer 32 may extend beyond the second layer 30, the extender 12 comprising the portion 32a of the first layer 32. The extender 12 is a continuation of the first layer 32 to reduce fabrication requirements. Alternatively, the extender 12 may be separately attached to the microactuator 10, and/or as shown in FIG. 3B a thermally insulating element 33 such as silicon dioxide may be added between the microactuator 10 and the extender 12. The extender 12 may comprise the same or different material as the first layer 32. In some implementations, the extender 12 may comprise silicon oxide or silicon nitride.

In some, but not necessarily all examples, the first layer 32 and/or the second layer 30 is configured as a resistive heater. Configuring a layer as a resistive heater implies that electrical current flows through one or both of the layers, causing resistive heating dependent on the electrical resistivity of the material of the layer. The applied stimulus for thermal actuation may comprise an electrical current applied to at least the second layer 30. Therefore, the bimorph material of the second layer 30 may be electrically conductive such as metal. Alternatively, the stimulus to the bimorph may be supplied indirectly via a separate material and/or layer.

FIG. 5 shows an example apparatus 1 wherein the component 14 is an optical component 14 such as a reflector. An example of a reflector is an optical mirror ('mirror' herein). The mirror may be a MEM mirror. The mirror may be flat or curved. However, aspects of FIG. 5 may be applicable for use with other optical components such as beam shaping optics, or non-optical components such as capacitor plates.

One or more of the plurality of microactuators 10a-10d of FIG. 5 have the characteristics described in relation to FIGS. 1 and 2 including void-filled extenders 12a-12d, and are optionally implemented as described in relation to FIG. 3A.

In FIG. 5 a plurality of microactuators 10a-10d are arranged around the component 14 and oriented to enable deflection of the component 14 about a plurality of axes 51, 52. In some examples, deflection of the component 14 may comprise rotation in the form of tilting and/or tipping the component 14. The axes 51, 52 may be orthogonal to each other. Alternatively, the component 14 may be deflectable in one axis 51 or 52 only.

The apparatus 1 may be configured to convert deflection of one or more microactuators 10 into rotation of the component 14 about one or more axes 51, 52. For rotation about two axes 51, 52, at least a first pair 10a, 10c of the plurality of microactuators 10a-10d is configured to enable deflection of the component 14 about a first rotational axis 51, and at least a second pair 10b, 10d of the plurality of microactuators 10a-10d is configured to enable deflection of the component 14 about a second rotational axis 52. The first rotational axis 51 may be orthogonal to the second rotational axis 52, and both axes 51, 52 may be substantially coplanar with the mirror if the component 14 is a mirror.

In FIG. 5, four microactuators 10a-10d are shown such that the pairs of microactuators 10a-10d do not comprise the same microactuators. The four microactuators 10a-10d may support the component 14 at four respective locations on the component 14, wherein the four locations are angularly separated by 90 degrees relative to each other around the centre of the component 14. Alternatively, at least three microactuators 10 may support the component 14 at three respective locations on the component 14, wherein the three locations are angularly separated by 120 degrees relative to each other around the centre of the component and provide the same number of degrees of freedom as four support locations. In further examples, more than four microactuators 10 may be provided.

In the above examples it is assumed that the support locations are evenly angularly separated around the perimeter of the component 14, however the support locations may be unevenly angularly separated in other examples.

Although FIG. 5 shows the microactuators 10 extending in different directions from each other, it is possible that at least some of the microactuators 10 could extend in substantially the same direction as other microactuators 10.

A microactuator 10 may be curved up towards the mirror in its neutral equilibrium (non-actuated) state when no heat is applied, as shown in FIG. 5. Heat may cause the microactuator 10 to deflect in a straightening direction, reducing its curvature. Alternatively, actuation may be configured to increase curvature based on the arrangement of the layers 30, 32.

As an alternative to FIG. 5, the microactuator 10 may form another shape in its neutral non-actuated state, such as flat or curved downwards. Further, the actuation direction may be either upwards or downwards.

The plurality of microactuators 10a-10d of FIG. 5 may be the same as each other, or one or more aspects affecting responsiveness and/or deflection may differ. For example, the microactuators 10a-10d may be differentiated to provide a slow axis and a fast axis, depending on the use case. A slower axis can advantageously reduce power consumption. Additionally or alternatively, one axis may provide a different range of motion than the other.

In FIG. 5, all the microactuators 10a-10d are below the component 14. Alternatively, the microactuator beams supporting the component 14 may be located to either side the component 14 or above the component 14.

FIG. 5 shows in more clarity how a resistive heater may be implemented. The second layer 30 comprises a first electrical terminal 54 such as a first conductive pad, and a second electrical terminal 56 such as a second conductive pad. The microactuator 10 provides an electrical length between the first electrical terminal 54 and the second electrical terminal 56 to resistively heat the bimorph. The first conductive pad and the second conductive pad may provide the fixed end 2 of the cantilever. The first conductive pad 54 and/or the second conductive pad 56 may be a continuation of the second layer 30 or a separate material. First electrical terminals 54a-54d and second electrical terminals 56a-56d may be provided for each corresponding microactuator 10a-10d. A single microactuator 10 implies a single pair of electrical terminals 54, 56.

An advantage of conductive pads, as shown in FIG. 5, is easier electrical connection of the apparatus to other electronic circuitry, due to the large pad surface area. Techniques such as probing and wire bonding can be used.

The second layer 30 comprises a first leg 30a extending away from the first electrical terminal 54, a direction change 30b changing the direction of the second layer 30 towards the second electrical terminal 56, and a second leg 30c extending towards the second electrical terminal 56. The direction change 30b may comprise a curve as shown, or a sharp turn. The first leg 30a, the direction change 30b, and the second leg 30c define the electrical length of the second layer 30.

In FIG. 5, but not necessarily all examples, the first leg 30a and the second leg 30c are parallel. The direction change 30b may be 180 degrees. More than one direction change 30b could be provided, if the microactuator 10 is wide. However, fewer direction changes reduce the chance of unintentional torsional deflections. In a further alternative example, no direction change 30b or second leg 30c is provided, and a flexible return wire may be used to close an electrical circuit.

FIG. 5 also shows that an electrically isolating slot 34 may be provided between the first leg 30a and the second leg 30c, to electrically isolate the first leg 30a and the second leg 30c from each other. The slot 34 may be through the second layer 30, or through both the first layer 32 and the second layer 30 for additional isolation. In FIG. 5, the slot 34 is elongated in a direction parallel to the first leg 30a and the second leg 30c. The direction change 30b of the second layer 30 extends widthwise from one side of the slot 34 to the other side of the slot 34. The number of slots may depend on the number of direction changes and legs.

FIG. 5 also demonstrates that overall resistive heating may be increased by introducing one or more discontinuities 31 along the electrical length of the second layer 30, if the material of the second layer 30 has low electrical resistivity, such as gold or copper. High electrical resistance is desirable so that a much lower applied voltage can achieve a same level of power dissipation. As shown in FIG. 5, a plurality of discontinuities 31a- . . . 31n may be provided, such as ten discontinuities 31a-31j.

The illustrated discontinuities 31 extend widthwise across the whole width of the first leg 30a and/or the second leg 30c and/or the second layer 30, presenting a break in the electrical length of the second layer 30. A discontinuity 31 may be thin, presenting an electrical gap of only a few micrometres in the electrical length of the second layer 30. Electrical current is forced to flow through the discontinuity 31 via different material at the discontinuities. The material at the discontinuities has a relatively-high-resistivity compared to the material of the second layer 30. In some, but not necessarily all examples, the material at the discontinuities may be the material of the first layer 32, which has higher electrical resistivity than the second layer 30, therefore increasing overall resistance. In this example, it would be understood that portions of the first layer 32 and portions of the second layer 30 are configured for resistive heating, wherein the first layer 32 at the discontinuities 31 provides the dominant source of resistive heating due to greater resistivity of the first layer 32.

A discontinuity 31 may be provided by removing material of the second layer 30, or by adding strips of different material with lower electrical conductivity at the expense of greater manufacturing time.

A discontinuity 31 is also significantly less complex to manufacture than varying the thickness of the second layer 30 to achieve a similar effect on electrical resistance.

In a study example, a 300-micrometre length microactuator shown in FIG. 5 used gold as the second layer 30. The gold had an electrical length of 600 micrometres due to a single direction change 30b. Discontinuities 31 were arranged in a pattern to increase the resistance from 5 ohms to 200 ohms.

FIG. 5 shows that the number of discontinuities 31a-31e in the first leg 30a and the number of discontinuities 31f-31j in the second leg 30c may be equal. Alternatively, the number of discontinuities 31 may be the same as FIG. 5 or different. The illustrated discontinuities 31 are evenly spaced along the electrical length, for even bimorph deflection, however they could be unevenly spaced to calibrate bimorph deflection. For similar reasons, the sizes of the discontinuities 31 may be the same or different.

In FIG. 5, each extender 12a-12d supports the component 14 via a corresponding coupling member 16a-16d. FIG. 5 shows that a coupling member 16 coupling the component 14 to the extender 12 may comprise a low-mass spring. The cross-sectional area of the coupling member 16 may be no more than 25% of the cross-sectional area of the extender 12, and is significantly less than 25% in FIG. 5 resulting in elastic spring-behaviour. In FIG. 5, but not necessarily all examples, the coupling member 16 is a serpentine spring following a meandering path to the component 14, with a plurality of direction changes. The serpentine path increases the elasticity of the coupling. The use of springs reduces rubbing or friction, resulting in behaviour more like an elastic hinge.

Figure 6:
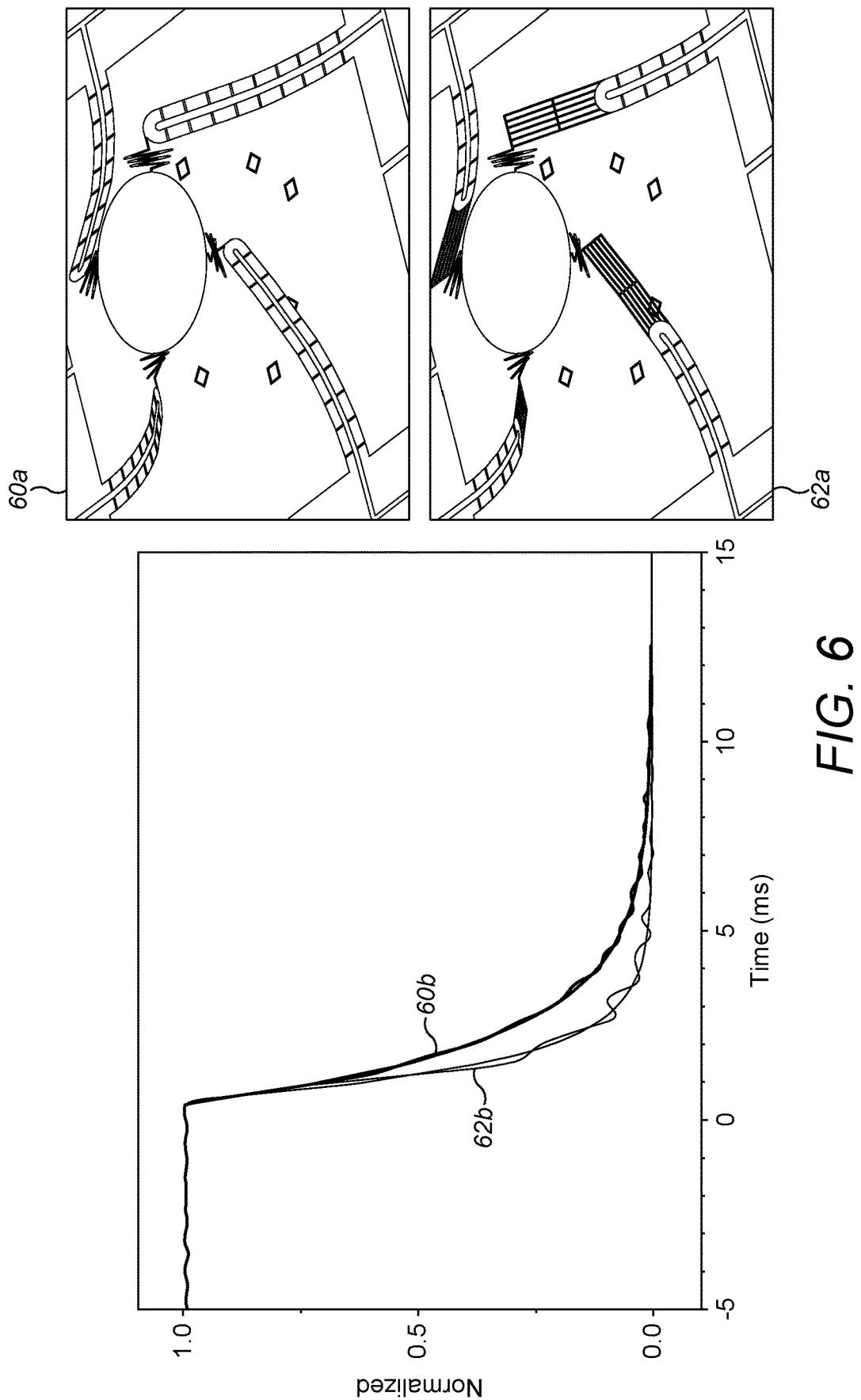
FIG. 6 shows another example of the subject matter described herein.

FIG. 6 is a graph of the results of a study example, testing the time response of the apparatus 1 of FIG. 5 for achieving a required deflection when a heating pulse is applied. The y-axis is normalized microactuator deflection from a base state and the x-axis is time.

A first line 60b in FIG. 6 plots the time response of a reference apparatus 60a comprising a full-length microactuator with no extender 12. A second line 62b in FIG. 6 plots the time response of an improved apparatus 62a matching that of FIG. 5. The improved apparatus 62a comprising the shorter microactuator 10 with the void-filled extender 12. In the reference apparatus 60a, L1=600 micrometres. In the improved apparatus 62a, L1=L2=300 micrometres. The extender design of FIG. 4B was used, so that in the tested improved apparatus 62a, the void fraction was 46%. The framework 20 made up 54% of the volume of the extender 12. The electrical power in each test was set to the value to achieve the required deflection. FIG. 6 shows that the response time is nearly halved in the improved apparatus 62a, demonstrating the advantages of the use of a shorter microactuator 10 with a void-filled extender 12 for applications that require fast response times.

A non-limiting example of an application that benefits from fast microactuator response times is optical coherence tomography. Optical coherence tomography is an imaging technique that uses low-coherence light to capture micrometre-resolution images (2D or 3D) from within optical scattering samples such as biological tissue. Optical coherence tomography can be used for medical imaging and nondestructive testing. Optical coherence tomography generally uses low-coherence interferometry, and usually the light is in the near-infrared spectrum.

Optical coherence tomography systems may be used for non-invasive health monitoring. Optical coherence tomography systems generally scan a laser at discrete points in a shaped (e.g. rectangular) array on the skin surface that is being scanned. A depth scan is performed at each array point by sweeping the wavelength. The scanned volume could be up to ten millimetres cubed or more, depending on factors such as required resolution and scanning speed. Backscattered light is detected during each array point scan and provides structural and/or chemical composition information. It is desirable to perform this scan quickly, so that information is acquired as rapidly as possible, which aids in the usefulness and applicability of the approach. A related factor is that if a scan takes too long, a patient may move, and the scan is no longer accurate. Some fast MEMS-based techniques require high electrical voltage to maintain high scan rates. High required voltages is impeding the development of portable optical coherence tomography systems with handheld scanners. Some MEMS-based techniques are too slow when using lower electrical voltages. Aspects of the present apparatus 1 advantageously enables a scanning technique that is fast and requires low electrical voltage, to facilitate the development of portable (or nonportable) optical coherence tomography systems. The apparatus 1 could even be made wearable.

Figure 7:
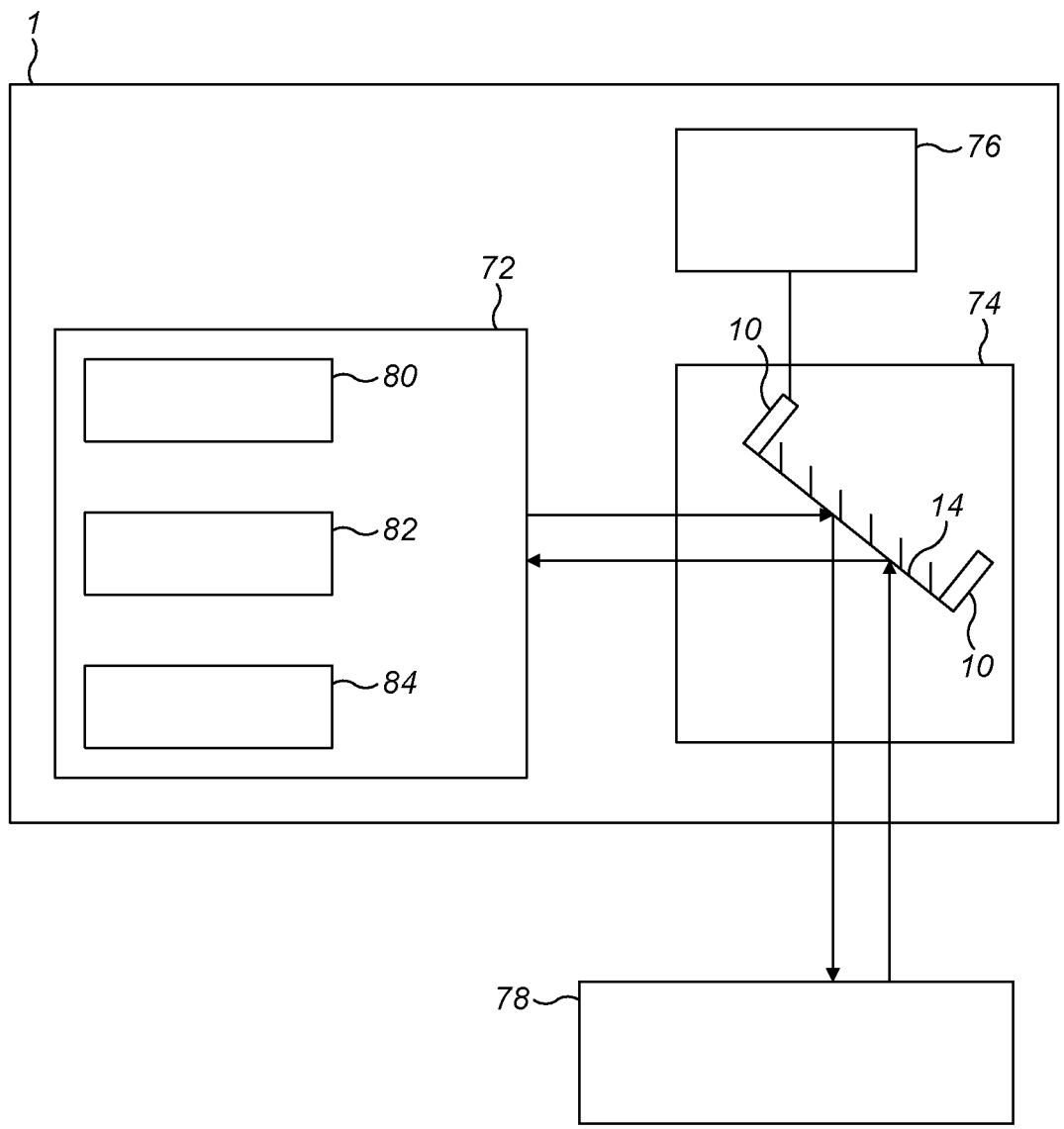
FIG. 7 shows another example of the subject matter described herein.

Therefore, FIG. 7 illustrates an example of the apparatus 1, wherein the apparatus 1 comprises an optical coherence tomography system 72 and an optical arrangement 74 comprising the optical component 14. In some, but not necessarily all examples, the apparatus 1 may also comprise a controller 76 or a communication interface for communicating with a remote controller.

The optical coherence tomography system 72 comprises means for providing a beam of light to a sample 78 and means for receiving reflected light back from the sample 78. The optical coherence tomography system 72 may also comprise means for combining the reflected light with reference light to enable the interference between the reflected light and the reference light to be analysed. For example, the optical coherence tomography system 72 may comprise an interferometer 80 and any other suitable means. The optical coherence tomography system 72 may comprise other elements that may enable light to be provided to a sample 78 and reflected light to be analysed to obtain an optical coherence tomography image. In some examples the integrated optoelectronic circuit may comprise one or more light sources 84 and one or more detectors 82. The light source 84 may comprise a coherent light source such as a laser or any other suitable light source. The detector 82 may comprise one or more diodes such as a photodiodes. The electrical output of the detector 82 comprises information about the light reflected from the sample 78. This can be processed to generate a three dimensional image of the sample 78. The controller 76 may comprise: at least one processor; and at least one memory including computer program code, the at least one memory and the computer program code configured to, with the at least one processor, cause the controller 76 at least to control the one or more microactuators 10.

The optical component 14 may be a mirror. The optical component 14 is positioned so that light from the light source 84 of the optical coherence tomography system 72 is incident on the optical component 14. The one or more microactuators 10 may be configured to move (e.g. rotate) the optical component 14 in at least one direction relative to the optical coherence tomography system 72. The microactuators 10 may be operably coupled to the controller 76.

The microactuators 10 and the optical component 14 are configured to enable the light to be scanned in at least one direction to enable a multi-dimensional optical coherence tomography image to be obtained. The optical component 14 may be deflected to enable scanning of different array points.

The optical arrangement 74 and/or the optical coherence tomography system 72 may also comprise conventional optical elements (not shown) such as lenses or beam splitters/combiners to shape and focus light, and direct light between the functional components of the apparatus 1.

Where a structural feature has been described, it may be replaced by means for performing one or more of the functions of the structural feature whether that function or those functions are explicitly or implicitly described.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one." or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims. For example, the component 14 could be an optical component for other applications that require fast movement, such as light detection and ranging (LIDAR). Alternatively, the component 14 could be other than an optical component, such as a capacitor plate. Features of the apparatus such as the extender may be applied to a microactuator beam configured to be actuated by another means than thermal actuation, such as magnetic actuation or electro-static actuation. This can provide advantages such as reducing the overall material mass required to span a particular distance, as the extender is lighter per unit length than many types of microactuator beam.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer and exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

We claim:

1. An apparatus comprising:
   a thermally-actuated microactuator configured to deflect a component in dependence on an applied stimulus; and
   an extender configured to increase deflection of the component by the microactuator, wherein the extender comprises one or more voids,
   wherein the microactuator comprises a bimorph, wherein the bimorph comprises a first layer and a second layer, and wherein the first layer and the second layer have different coefficients of thermal expansion,
   wherein at least one of the first layer or the second layer is configured as a resistive heater,
   wherein the second layer comprises one or more discontinuities along its electrical length, for different resistive heating at the one or more discontinuities than resistive heating of the second layer, and
   wherein the one or more discontinuities are locations where material has been removed from the second layer, or where strips of different material with lower electrical conductivity than that of the second layer have been added.

2. The apparatus of claim 1, wherein the extender has a void fraction of at least 25%.

3. The apparatus of claim 1, wherein the extender comprises a framework of spaced members separated by one or more voids.

4. The apparatus of claim 1, wherein the length of the extender is at least 25% of the length of the microactuator.

5. The apparatus of claim 1, wherein at least the extender is cantilevered.

6. The apparatus of claim 1, wherein a portion of the first layer extends beyond the second layer, the extender comprising the portion of the first layer.

7. The apparatus of claim 1, wherein the microactuator comprises at least one electrically isolating slot through the first layer and the second layer, and wherein the second layer comprises a direction change extending from one side of the slot to the other side of the slot.

8. The apparatus of claim 1, wherein the microactuator is one of a plurality of microactuators of the apparatus, wherein the plurality of microactuators are arranged to enable deflection of the component about a plurality of axes.

9. The apparatus of claim 8, wherein at least a first pair of the plurality of microactuators is configured to enable rotation of the component about a first axis, and wherein at least a second pair of the plurality of microactuators is configured to enable rotation of the component about a second axis.

10. The apparatus of claim 1, comprising the component, wherein the component is a reflector.

11. The apparatus of claim 10, wherein the reflector is an optical mirror.

12. The apparatus of claim 10, comprising an optical coherence tomography system, wherein the reflector is positioned so that light from a light source of the optical coherence tomography system is incident on the reflector, and wherein the microactuator is configured to move the reflector in at least one direction relative to the optical coherence tomography system.

13. The apparatus of claim 1, wherein the one or more discontinuities force electrical current to flow through the first layer, material of the first layer having a higher electrical resistivity than material of the second layer.

* * * * *